US009653648B2

(12) United States Patent
Huang et al.

(10) Patent No.: US 9,653,648 B2
(45) Date of Patent: May 16, 2017

(54) LED DIE

(71) Applicant: ADVANCED OPTOELECTRONIC TECHNOLOGY, INC., Hsinchu Hsien (TW)

(72) Inventors: Chia-Hung Huang, Hsinchu (TW); Ching-Hsueh Chiu, Hsinchu (TW); Shun-Kuei Yang, Hsinchu (TW); Po-Min Tu, Hsinchu (TW); Shih-Cheng Huang, Hsinchu (TW)

(73) Assignee: ADVANCED OPTOELECTRONIC TECHNOLOGY, INC., Hsinchu Hsien (TW)

( * ) Notice: Subject to any disclaimer, the term of this patent is extended or adjusted under 35 U.S.C. 154(b) by 0 days.

(21) Appl. No.: 14/820,268

(22) Filed: Aug. 6, 2015

(65) Prior Publication Data
US 2016/0064605 A1  Mar. 3, 2016

(30) Foreign Application Priority Data

Sep. 2, 2014 (CN) .......................... 2014 1 0442016

(51) Int. Cl.
| | |
|---|---|
| H01L 33/20 | (2010.01) |
| H01L 33/42 | (2010.01) |
| H01L 33/00 | (2010.01) |
| H01L 33/38 | (2010.01) |

(52) U.S. Cl.
CPC ............ H01L 33/20 (2013.01); H01L 33/005 (2013.01); H01L 33/382 (2013.01); H01L 2933/0016 (2013.01)

(58) Field of Classification Search
CPC ...... H01L 33/20; H01L 33/005; H01L 33/382; H01L 2933/0016
See application file for complete search history.

(56) References Cited

U.S. PATENT DOCUMENTS

2002/0084452 A1* 7/2002 Ota .......................... H01L 33/02
257/13
2012/0273830 A1* 11/2012 Huang ..................... H01L 33/14
257/99

FOREIGN PATENT DOCUMENTS

TW      201225338 A    6/2012
TW      201244161 A   11/2012

* cited by examiner

*Primary Examiner* — Walter H Swanson
(74) *Attorney, Agent, or Firm* — Steven Reiss

(57) ABSTRACT

An LED die includes a substrate, a first semiconductor layer, an active layer, a second semiconductor layer, a transparent conductive layer, a first electrode and a second electrode. The first semiconductor layer, the active layer, the second semiconductor layer and the transparent conductive layer are successively formed on the substrate. The first electrode and the second electrode respectively is formed on the first semiconductor layer and the transparent conductive layer. A plurality of grooves defined on the first semiconductor layer, and a plurality of hole groups defined on the second semiconductor layer. The present disclosure also provides a method of manufacturing the LED die.

17 Claims, 2 Drawing Sheets

LED DIE

CROSS-REFERENCE TO RELATED APPLICATIONS

This application claims priority to Chinese Patent Application No. 201410442016.8 filed on Sep. 2, 2014, the contents of which are incorporated by reference herein.

FIELD

The disclosure relates to an LED (light emitting diode) die and a method of manufacturing the LED die.

BACKGROUND

An LED die typically includes a light emitting structure and electrodes. Current unevenness in the light emitting structure affects light emitted from the light emitting structure.

BRIEF DESCRIPTION OF THE DRAWINGS

Implementations of the present technology will now be described, by way of example only, with reference to the attached figures.

DETAILED DESCRIPTION OF EXEMPLARY EMBODIMENTS

It will be appreciated that for simplicity and clarity of illustration, numerous specific details are set forth in order to provide a thorough understanding of the exemplary embodiments described herein. However, it will be understood by those of ordinary skill in the art that the exemplary embodiments described herein can be practiced without these specific details. In other instances, methods, procedures and components have not been described in detail so as not to obscure the related relevant feature being described. Also, the description is not to be considered as limiting the scope of the exemplary embodiments described herein. The drawings are not necessarily to scale and the proportions of certain parts have been exaggerated to better illustrate details and features of the present disclosure. The description is not to be considered as limiting the scope of the exemplary embodiments described herein.

Figure 1:
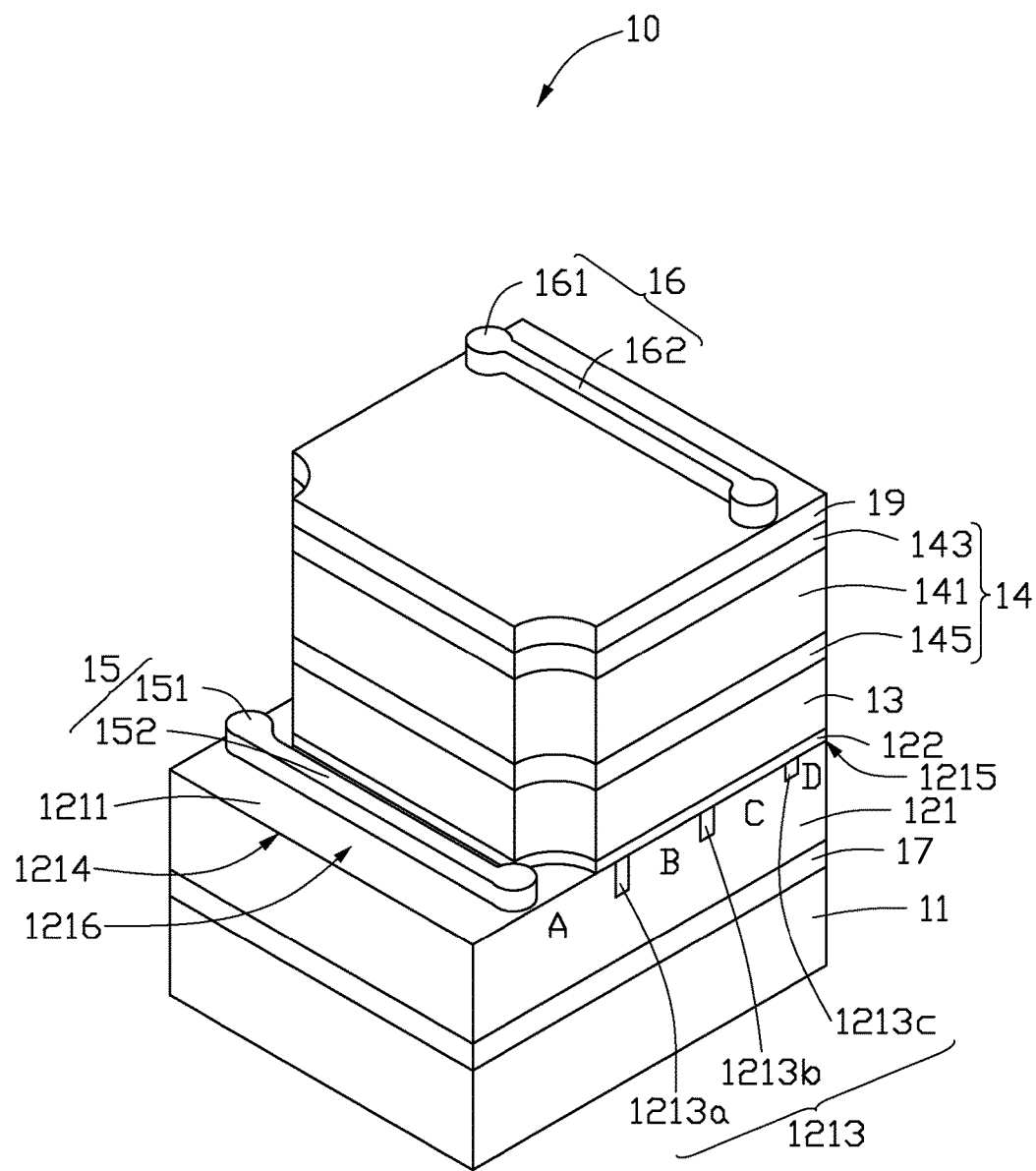
FIG. 1 is a perspective view showing an LED die in accordance with an exemplary embodiment of the present disclosure.

Referring to FIG. 1, an LED die 10 includes a substrate 11, a first semiconductor layer 121, an active layer 13, a second semiconductor layer 14, a transparent conductive layer 19, a first electrode 15 and a second electrode 16. The first semiconductor layer 121, the active layer 13, the second semiconductor layer 14 and the transparent conductive layer 19 are successively stacked on the substrate 11. The first electrode 15 is formed on the first semiconductor layer 121. The second electrode 16 is formed on the transparent conductive layer 19.

The substrate 11 can be made of sapphire ($Al_2O_3$), silicon carbide (SiC), silicon (Si), gallium arsenide (GaAs) or zinc oxide (ZnO).

The first semiconductor layer 121 defines a first area 1211 and a second area 1212. The first area 1211 is exposed. The second area 1212 is covered by the active layer 13. The active layer 13 and the second semiconductor layer 14 are successively stacked on the second area 1212. The first semiconductor layer 121 is a first doped semiconductor layer. In at least one exemplary embodiment, the first semiconductor layer 121 can be an n-type semiconductor layer. A buffer layer 17 can be formed on the substrate 11, and sandwiched between the substrate 11 and the first semiconductor layer 121. The buffer layer 17 can be made of gallium nitride (GaN) or aluminium nitride (AlN).

A plurality of grooves 1213 are defined in the first semiconductor layer 121. The grooves 1213 are defined in the second area 1212. The grooves 1213 are spaced apart from each other. Each groove 1213 is depressed a depth from a surface 1216 of the first semiconductor layer 121 towards the substrate 11. As one moves in a direction away from a first edge 1214 of the first semiconductor layer 121 towards a second edge 1215 of the first semiconductor layer 121 and along the surface 1216 of the first semiconductor layer 121, the depth of each subsequent groove 1213 is less than a depth of a prior groove 1213. In at least one exemplary embodiment, the grooves 1213 include a first groove 1213a, a second groove 1213b and a third groove 1213c. The first groove 1213a, the second groove 1213b and the third groove 1213c are positioned as one moves in the direction away from the first edge 1214 of the first semiconductor layer 121 towards the second edge 1215 of the first semiconductor layer 121 and along the surface 1216 of the first semiconductor layer 121. The first groove 1213a, the second groove 1213b and the third groove 1213c divide the first semiconductor layer 121 into four regions, which are a first region A, a second region B, a third region C and a fourth region D. The first region A is from the first edge 1214 of the first semiconductor layer 121 to adjacent the first groove 1213a. The second region B is between the first groove 1213a and the second groove 1213b. The third region C is between the second groove 1213b and the third groove 1213c. The fourth region D is from the third groove 1213c to the second edge 1215 of the first semiconductor layer 121.

A semiconductor film 122 can be formed on a portion of the first semiconductor layer 12 covering the grooves 1213. The semiconductor film 122 is sandwiched between the first semiconductor layer 121 and the active layer 13. The type of doping of the semiconductor film 122 can be the same as the type of doping of the first semiconductor layer 12. In this exemplary embodiment, the semiconductor film 122 can be an n-type semiconductor layer.

The first electrode 15 is formed on the exposed, first area 1211 the first semiconductor layer 121. The first electrode 15 includes two first pads 151 and a first connecting portion 152. The first connecting portion 152 connects the two first pads 151. The two first pads 151 are disposed adjacent two opposite lateral sides of the first connecting portion 152, and the first connecting portion 152 is generally parallel to the first edge 1214 of the first semiconductor layer 121.

The second semiconductor layer 14 includes a second doped semiconductor layer 141, a first ohmic contact layer 143 and a second ohmic contact layer 145. The second doped semiconductor layer 141 is sandwiched between the first ohmic contact layer 143 and the second ohmic contact layer 145. The second ohmic contact layer 145 is directly attached to the active layer 13. In at least one exemplary embodiment, the second doped semiconductor layer 141 can be a p-type semiconductor layer.

Figure 2:
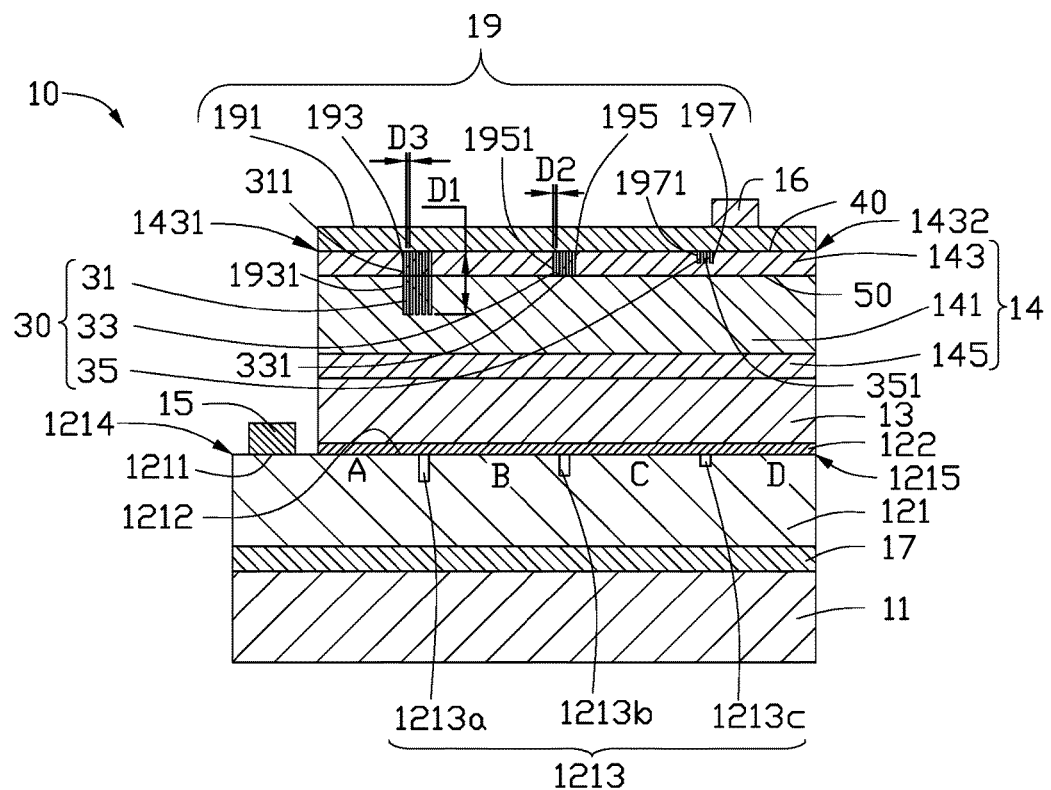
FIG. 2 is a cross sectional view showing the LED die of FIG. 1.

Referring to FIG. 2, a plurality of hole groups 30 are defined in the second semiconductor layer 14. Each hole group 30 recesses a depth from the second semiconductor layer 14 towards the active layer 13. The number of the hole groups 30 is the same as the number of the grooves 1213. Each hole group 30 is aligned with a corresponding groove 1213. As one moves in a direction away from a first edge 1431 of the second semiconductor layer 14 towards a second edge 1432 of the second semiconductor layer 14 and along a top surface 40 of the second semiconductor layer 14, the depth of each subsequent hole group 30 is less than a depth of a prior hole group 30. Each hole group 30 includes a plurality of holes 311, 331, 351. The holes in each hole group 30 have a same depth D1, a same diameter D2 and a same distance D3 between adjacent holes in that hole group. As one moves in the direction away from the first edge 1431 of the second semiconductor layer 14 towards the second edge 1432 of the second semiconductor layer 14 and along the top surface 40 of the second semiconductor layer 14, the number of holes of each subsequent hole group 30 is less than a number of holes of a prior hole group 30.

In this exemplary embodiment, the hole groups 30 includes a first hole group 31, a second hole group 33 and a third hole group 35. The first hole group 31, the second hole group 33 and the third hole group 35 are spaced apart from each other. The first hole group 31 recesses from the top surface 40 of the first ohmic contact layer 143 through the first ohmic contact layer 143, and enters into and ends in the second doped semiconductor layer 141. The second hole group 33 recesses from the top surface 40 of the first ohmic contact layer 143 through the first ohmic contact layer 143, and ends at a bottom surface 50 of the first ohmic contact layer 143. The third hole group 35 recesses from the top surface 40 of the first ohmic contact layer 143 and enters into and ends in the first ohmic contact layer 143.

The transparent conductive layer 19 includes a body 191, a first extending portion 193, a second extending portion 195 and a third extending portion 197. The body 191 covers the first ohmic contact layer 143. The body 191 is a film. The first extending portion 193 fills in the first hole group 31. The second extending portion 195 fills in the second hole group 33. The third extending portion 197 fills in the third hole group 35. The first extending portion 193 have a plurality of first extending fingers 1931, each first extending finger 1931 is corresponding to one of the holes 311 of the first hole group 31. The second extending portion 195 has a plurality of second extending fingers 1951, each second extending finger 1951 is corresponding to one of the holes 331 of the second hole group 33. The third extending portion 197 has a plurality of third extending fingers 1971, each third extending finger 1971 is corresponding to one of the holes 351 of the third hole group 35. The depths of the first extending finger 1931 is greater than the depths of the second extending finger 1951, and the depths of the second extending fingers 1951 is greater than the depths of the third extending fingers 1971. In at least one exemplary embodiment, the diameter of the the first extending finger 1931, the second extending finger 1951 and the third extending finger 1971 are the same. The distances between adjacent first extending fingers 1931, the distances between adjacent second extending fingers 1951 and the distances between the adjacent third extending fingers 1971 are also the same. A resistance of the transparent conductive layer 19 is less than the resistances of the first ohmic contact layer 143, the second doped semiconductor layer 141 and the second ohmic contact layer 145. The transparent conductive layer 19 can be made of indium tin oxide (ITO).

The second electrode 16 is formed on the body 191 of the transparent electrically connecting layer 19. The second electrode 16 includes two second pads 161 and a second connecting portion 162. The second connecting portion 162 connects the two second pads 161. The two second pads 161 are disposed adjacent two opposite lateral sides of the second connecting portion 162, and the second connecting portion 162 is generally parallel to the second edge 1432 of the second semiconductor layer 14.

A method of manufacturing an LED die is also provided. The method may include:

providing a substrate 11 and stacking a first semiconductor layer 121 on the substrate 11, the first semiconductor layer 121 includes a first area 1211 and a second area 1212;

defining a plurality of grooves 1213 in the second area 1212, the grooves 1213 are spaced apart from each other, each grooves 1213 is depressed a depth from a surface 1216 of the first semiconductor layer 121 towards the substrate 11, as one moves in a direction away from a first edge 1214 of the first semiconductor layer 121 towards a second edge 1215 of the first semiconductor layer 121 and along the surface 1216 of the first semiconductor layer 121, the depth of each subsequent groove 1213 is less than a depth of a prior groove 1213;

stacking an active layer 13 and a second semiconductor layer 14 successively on the second area 1212;

etching the second semiconductor layer 14 to define a plurality of hole groups 30, the hole groups 30 includes a first hole group 31, a second hole group 33 and a third hole group 35;

stacking a transparent conductive layer 19 on the second semiconductor layer 14, the transparent conductive layer 19 includes a body 191, a first extending portion 193, a second extending portion 195 and a third extending portion 197, the body 191 covers the first ohmic contact layer 143, the first extending portion 193 fills in the first hole group 31, the second extending portion 195 fills in the second hole group 33, and the third extending portion 197 fills in the third hole group 35;

forming a first electrode 15 on the first area 1211 of the first semiconductor layer 121 and a second electrode 16 on the body 191 of the transparent conductive layer 19.

A semiconductor film 122 can be formed on a portion of the first semiconductor layer 12 covering the grooves 1213. The semiconductor film 122 is sandwiched between the first semiconductor layer 121 and the active layer 13.

A buffer layer 17 can be formed on the substrate 11, and sandwiched between the substrate 11 and the first semiconductor layer 121.

The exemplary embodiments shown and described above are only examples. Many details are often found in the art such as the other features of an LED die and a method of manufacturing the LED die. Therefore, many such details are neither shown nor described. Even though numerous characteristics and advantages of the present technology have been set forth in the foregoing description, together with details of the structure and function of the present disclosure, the disclosure is illustrative only, and changes may be made in the detail, including in matters of shape, size and arrangement of the parts within the principles of the present disclosure up to, and including the full extent established by the broad general meaning of the terms used in the claims. It will therefore be appreciated that the exemplary embodiments described above may be modified within the scope of the claims.

What is claimed is:

1. An LED die comprising:
   a substrate;
   a first semiconductor layer, an active layer, a second semiconductor layer and a transparent conductive layer successively stacked on the substrate; and
   a first electrode and a second electrode respectively formed on the first semiconductor layer and the transparent conductive layer;
   wherein a plurality of grooves are defined in the first semiconductor layer, each groove is depressed to a depth from a surface of the first semiconductor layer towards the substrate, a plurality of hole groups are defined in the second semiconductor layer;
   wherein, in a direction from a first edge of the second semiconductor layer towards a second edge of the second semiconductor layer and along a top surface of the second semiconductor layer, a depth of a subsequent hole group is less than a depth of a prior hole group.

2. The LED die of claim 1, wherein the first semiconductor layer defines a first area and a second area, the first area is exposed, and the second area is covered by the active layer.

3. The LED die of claim 2, wherein the grooves are defined in the second area.

4. The LED die of claim 2, wherein the first electrode is formed on the first area.

5. The LED die of claim 1, wherein the grooves are spaced apart from each other.

6. The LED die of claim 1, wherein in a direction away from a first edge of the first semiconductor layer towards a second edge of the first semiconductor layer and along the surface of the first semiconductor layer, the depth of each subsequent groove is less than the depth of a prior groove.

7. The LED die of claim 1, wherein the grooves comprise a first groove, a second groove and a third groove, and the first groove, the second groove and the third groove are positioned as one moves in a direction away from a first edge of the first semiconductor layer towards a second edge of the first semiconductor layer and along the surface of the first semiconductor layer.

8. The LED die of claim 1, wherein the second semiconductor layer comprises a second doped semiconductor layer, a first ohmic contact layer and a second ohmic contact layer, the second doped semiconductor layer is sandwiched between the first ohmic contact layer and the second ohmic contact layer, and the second ohmic contact layer is directly attached to the active layer.

9. The LED die of claim 8, wherein the hole groups comprise a first hole group, a second hole group and a third hole group, and the first hole group, the second hole group and the third hole group are defined spaced apart from each other.

10. The LED die of claim 9, wherein the first hole group recesses from a top surface of the first ohmic contact layer through the first ohmic contact layer, and enters into and ends in the second doped semiconductor layer, the second hole group recesses from the top surface of the first ohmic contact layer through the first ohmic contact layer, and ends at a bottom surface of the first ohmic contact layer, and the third hole group recesses from the top surface of the first ohmic contact layer and enters into and ends in the first ohmic contact layer.

11. The LED die of claim 10, wherein the transparent conductive layer comprises a body, a first extending portion, a second extending portion and a third extending portion, the body covers the first ohmic contact layer, and the first extending portion, the second extending portion and the third extending portion respectively fills in the first hole group, the second hole group and the third hole group.

12. The LED die of claim 8, wherein a resistance of the transparent conductive layer is less than the first ohmic contact layer, the second doped semiconductor layer and the second ohmic contact layer.

13. The LED die of claim 1, wherein each hole group recesses a depth from the second semiconductor layer to the active layer.

14. The LED die of claim 1, wherein the number of the hole groups is the same as the number of the grooves.

15. The LED die of claim 1, wherein each hole group comprises a plurality of holes.

16. The LED die of claim 15, wherein the holes in each hole group have a same depth, a same diameter and a same distance between adjacent holes in that hole group.

17. The LED die of claim 15, wherein in a direction away from the first edge of the second semiconductor layer towards the second edge of the second semiconductor layer and along the top surface of the second semiconductor layer, a number of holes of each subsequent hole group is less than a number of holes of a prior hole group.

* * * * *